(12) United States Patent
Fujimori

(10) Patent No.: US 7,361,540 B2
(45) Date of Patent: Apr. 22, 2008

(54) METHOD OF REDUCING NOISE DISTURBING A SIGNAL IN AN ELECTRONIC DEVICE

(75) Inventor: Ichiro Fujimori, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 374 days.

(21) Appl. No.: 11/030,809

(22) Filed: Jan. 7, 2005

(65) Prior Publication Data

US 2005/0124098 A1 Jun. 9, 2005

Related U.S. Application Data

(63) Continuation of application No. 10/801,290, filed on Mar. 15, 2004, now Pat. No. 6,995,431, and a continuation of application No. 10/801,260, filed on Mar. 15, 2004, and a continuation of application No. 10/706,218, filed on Nov. 12, 2003, now Pat. No. 6,844,226, and a continuation of application No. 10/294,880, filed on Nov. 14, 2002, now Pat. No. 6,870,228.

(60) Provisional application No. 60/402,095, filed on Aug. 7, 2002.

(51) Int. Cl.
| | |
|---|---|
| H01L 21/8238 | (2006.01) |
| H01L 21/8234 | (2006.01) |
| H01L 21/8244 | (2006.01) |
| H01L 21/8242 | (2006.01) |
| H01L 21/336 | (2006.01) |
| H01L 21/76 | (2006.01) |
| H01L 21/04 | (2006.01) |

(52) U.S. Cl. ........... 438/199; 438/200; 438/210; 438/217; 438/218; 438/238; 438/239; 438/381; 438/382; 438/294; 438/305; 438/451; 438/510; 438/914; 257/E21.544; 257/E21.642; 257/E21.644; 257/E27.062

(58) Field of Classification Search .............. None
See application file for complete search history.

(56) References Cited

U.S. PATENT DOCUMENTS

| 5,581,103 A | 12/1996 | Mizukami et al. |
| 5,994,741 A | 11/1999 | Koizumi et al. |
| 6,212,671 B1 | 4/2001 | Kanehira et al. |
| 6,356,497 B1 | 3/2002 | Puar et al. |

FOREIGN PATENT DOCUMENTS

| KR | 2002-84514 | 11/2002 |

OTHER PUBLICATIONS

Korean Office Action issued on Oct. 31, 2005 for KR 2004-1815.

*Primary Examiner*—David E Graybill
(74) *Attorney, Agent, or Firm*—McAndrews, Held & Malloy, Ltd.

(57) ABSTRACT

Certain aspects of a method for reducing noise disturbing at least one signal in an electronic device may comprise shielding a first layer doped with a first dopant from a signaling layer employing a second layer doped with a second dopant. A first signaling component of the signaling layer may be coupled to the second layer and a second signaling component of the signaling layer may be coupled to the second layer. The second layer may be coupled to the first layer, and this reduces the signal disturbing noise in the electronic device. Shielding the first layer from the signaling layer may comprise disposing the second layer between the first layer and the signaling layer. Shielding the first layer from the signaling layer may comprise disposing a deep N-well between the first layer and the signaling layer.

10 Claims, 3 Drawing Sheets

METHOD OF REDUCING NOISE DISTURBING A SIGNAL IN AN ELECTRONIC DEVICE

CROSS-REFERENCE TO RELATED APPLICATIONS

This application is a continuation of the following U.S. patent applications: Ser. No. 10/294,880 filed on Nov. 14, 2002, now U.S. Pat. No. 6,870,228 Ser. No. 10/706,218 filed on Nov. 12, 2003, now U.S. Pat. No. 6,844,226 Ser. No. 10/801,260 filed on Mar. 15, 2004, and Ser. No. 10/801,290 filed on Mar. 15, 2004, now U.S. Pat. No. 6,995,431 all of which make reference to, claim priority to and claim the benefit of U.S. Provisional Patent Application Ser. No. 60/402,095 filed on Aug. 7, 2002.

All of the above stated applications are hereby incorporated herein by reference in their respective entireties.

BACKGROUND OF THE INVENTION

As more and more functional blocks are added, for example, to a chip, an integrated circuit (IC), or an integrated system or device, the risk of generation and propagation of noise between different functional blocks, or within a functional block, may become quite substantial.

An exemplary conventional complementary metal oxide semiconductor (CMOS) transistor arrangement is illustrated in FIG. 1. As shown in FIG. 1, the conventional CMOS transistor arrangement 10 includes an n-channel MOS (NMOS) transistor 30 and a p-channel MOS (PMOS) transistor 40. The conventional CMOS arrangement 10 also includes a p-substrate 20 (e.g., a p$^-$-substrate). The NMOS transistor 30 is disposed in the p-substrate 20. The NMOS transistor 30 includes a p$^+$-body (B), an n$^+$-source (S) and an n$^+$-drain (D) disposed in the p-substrate 20. A voltage source $V_{SS}$ 7 having a ground is coupled to the p$^+$-body (B) and the n$^+$-source (S) of NMOS transistor 30. An input line 5 is coupled to a gate (G) of the NMOS transistor 30. An output line 15 is coupled to the n$^+$-drain (D) of the NMOS transistor 30. The PMOS transistor 40 includes an n-well 50 that is disposed in the p-substrate 20. The PMOS transistor 40 also includes an n$^+$-body (B), a p$^+$-source (S) and a p$^+$-drain (D) disposed in the n-well 50. A voltage source $V_{DD}$ 17 is coupled to the p$^+$-source (S) and the n$^+$-body (B) of PMOS transistor 50. The input line 5 is also coupled to a gate of the PMOS transistor 40. The output line 15 is also coupled to the p$^+$-drain (D) of the PMOS transistor 40.

During normal operation of the conventional CMOS transistor arrangement 10, voltage sources $V_{SS}$ 7 and $V_{DD}$ 17 may be noisy. For example, noise may be caused by other circuitry found on or coupled to the chip that may directly or indirectly affect the voltage sources $V_{SS}$ 7 and $V_{DD}$ 17. High swing or high power devices, such as data drivers in a wire line communication system or transmitters in wireless communications systems, may be sources of noise. Noise may also be caused, for example, by the driving of active circuits. In one example, the voltage sources may be coupled to active circuitry (e.g., active portions of an inverter circuit) which may cause transient currents to flow during signal transitions from a high level to a low level or from a low level to a high level. In another example, noise may be caused by transitions in a signal propagated or generated by the chip.

In the NMOS transistor 30, if the voltage source $V_{SS}$ 7 is noisy, then the noise may propagate to the p-substrate 20 via, for example, at least through the resistive coupling 9 between the p$^+$-body (B) and the p-substrate 20. In the PMOS transistor 40, if the voltage source $V_{DD}$ 17 is noisy, then the noise may propagate to the n-well 50 via the n$^+$-body (B) of the PMOS transistor 40 via a resistive coupling 19. The noise in the n-well 50 may propagate to the p-substrate 20 via, for example, at least the capacitive coupling 29 between the n-well 50 and the p-substrate 20. If the noise is able to propagate to the p-substrate 20, then noise may propagate to or otherwise affect other circuits on or off the chip that may be coupled to the p-substrate 20.

FIG. 1A shows another conventional CMOS arrangement 10, which is similar to the conventional CMOS arrangement 10 shown in FIG. 1, except that a quieter voltage source $V_{SS}$ 3 may be coupled to the p$^+$-body (B) of the NMOS transistor 30 and a noisy voltage source $V_{SS}$ 7 may be coupled to the n$^+$-source (S) of the NMOS transistor 30. Thus, less noise is resistively coupled from the p$^+$-body (B) to the p-substrate 20. To a lesser extent, noise may be capacitively coupled between the n$^+$-source and the p-substrate 20. Noise may be coupled from the PMOS transistor 40 to the p-substrate 20, as described above with respect to the conventional CMOS arrangement 10, and as shown in FIG. 1. In the CMOS arrangement of FIG. 1A, noise may substantially propagate to the p-substrate 20. Accordingly, there is a need to mitigate noise in the substrate of a chip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain aspects of the invention may be found in a method for reducing noise disturbing at least one signal in an electronic device. The method may comprise shielding a first layer doped with a first dopant from a signaling layer employing a second layer doped with a second dopant. A first signaling component of the signaling layer may be coupled to the second layer and a second signaling component of the signaling layer may be coupled to the second layer. The second layer may be coupled to the first layer, and this reduces the signal disturbing noise in the electronic device. Shielding the first layer from the signaling layer may comprise disposing the second layer between the first layer and the signaling layer. Shielding the first layer from the signaling layer may comprise disposing a deep N-well between the first layer and the signaling layer.

In a further aspect of the invention, a quiet voltage source and/or a noisy voltage source may be coupled to the first signaling component. A quiet voltage source and/or a noisy voltage source may also be coupled to the second signaling component. Coupling the first signaling component to the second layer may comprise capacitively coupling the first signaling component to the second layer. Furthermore, coupling the second signaling component to the second layer may comprise resistively coupling the second signaling component to the second layer. A noisy voltage source may be coupled to the second signaling component, and a quiet voltage source may be coupled to the first signaling component. The method may further comprise producing approximately equal voltage levels from the noisy voltage source and the quiet voltage source. A quiet voltage source may be coupled to the second signaling component and a noisy voltage source may be coupled to the first signaling component. Approximately equal voltage levels may be produced by the noisy voltage source and the quiet voltage source.

In accordance with an embodiment of the invention, the first signaling component may be a first transistor, for example, a p-type transistor. In this regard, a voltage source may be coupled to a source of the p-type transistor, wherein the p-type transistor comprises a p-channel metal oxide semiconductor (PMOS) transistor. A voltage source may be coupled to a body of the p-type transistor, wherein the p-type transistor comprises a p-channel metal oxide semiconductor (PMOS) transistor. The second signaling component may comprise a second transistor, for example, an n-type transistor. A voltage source may be coupled to a source of the n-type transistor, wherein the n-type transistor comprises an n-channel metal oxide semiconductor (NMOS) transistor. A voltage source may be coupled to a body of the n-type transistor, and the n-type transistor may comprise an n-channel metal oxide semiconductor (NMOS) transistor. The second layer may be capacitively coupled to the first layer.

These and other advantages, aspects and novel features of the present invention, as well as details of an illustrated embodiment thereof, will be more fully understood from the following description and drawings.

DETAILED DESCRIPTION OF THE INVENTION

Figure 1:
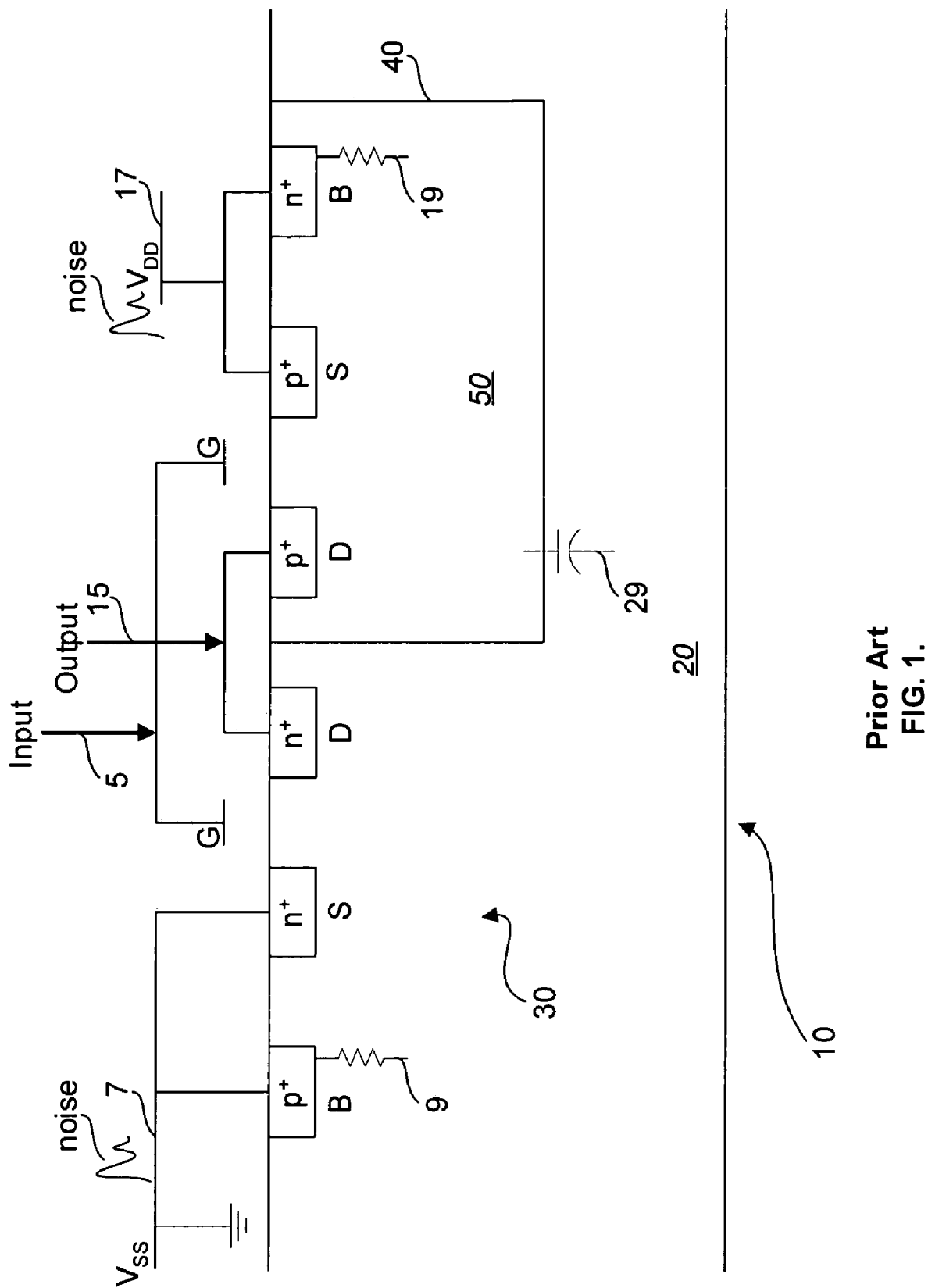
FIGS. 1 and 1A show embodiments of conventional complementary metal oxide semiconductor (CMOS) transistor arrangements.
Figure 1A:
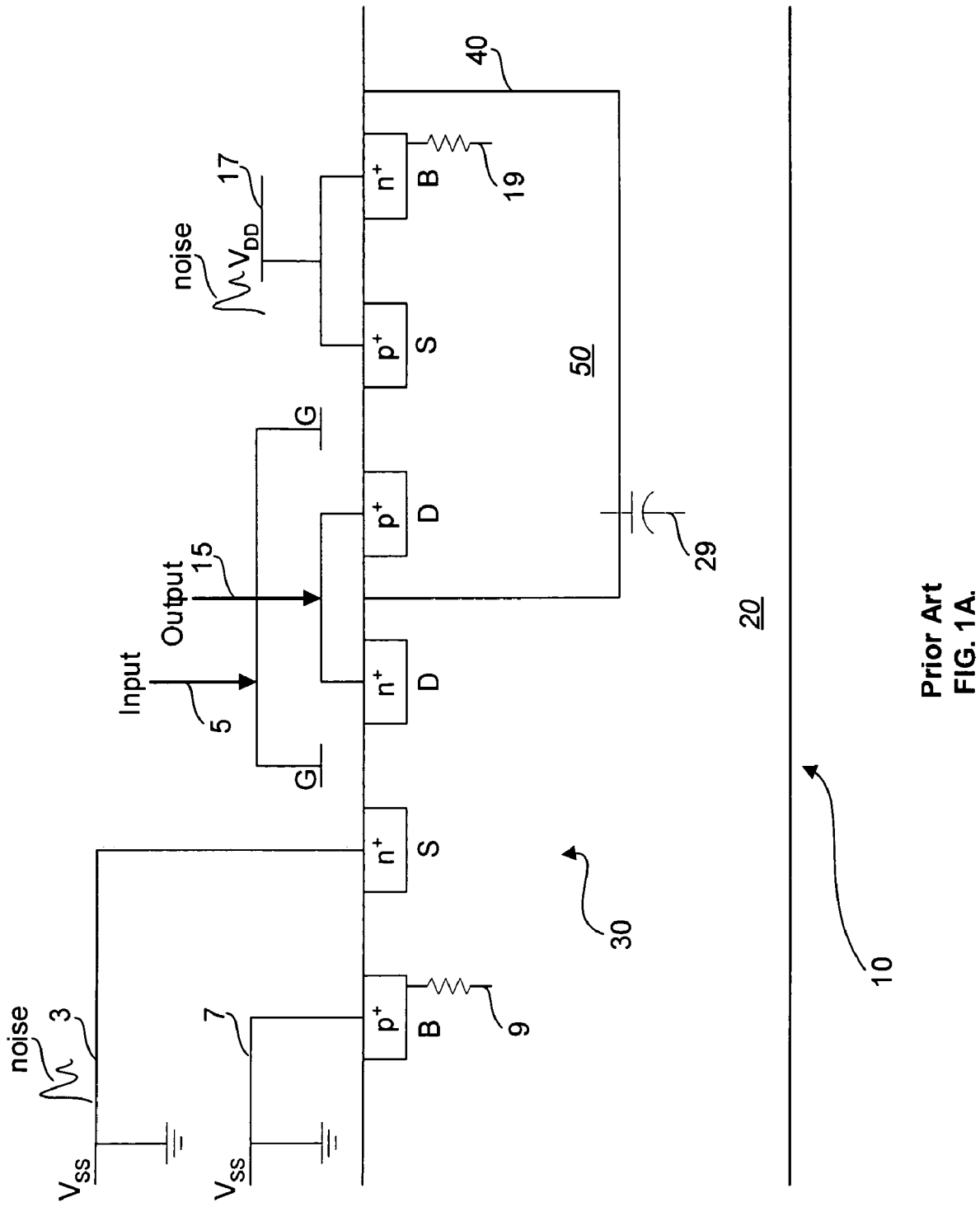

Certain aspects of the invention may be found in a method for reducing noise such as voltage sources noise from $V_{DD}$ 130 or $V_{SS}$ 170 disturbing at least one signal such as input 150 or output 160 in an electronic device such as a CMOS transistor 60. The method may comprise shielding a first layer 70 doped with a first dopant $p^+$ from a signaling layer 85 employing a second layer 80 doped with a second dopant $n^-$. A first signaling component such as a NMOS transistor 90 of the signaling layer 85 may be coupled to the second layer 80 and a second signaling component such as a PMOS transistor 100 of the signaling layer 85 may be coupled to the second layer 80. The second layer 80 may be coupled to the first layer 70, and this reduces the signal disturbing noise in the electronic device. Shielding the first layer 70 from the signaling layer 85 may comprise disposing the second layer 80 between the first layer 70 and the signaling layer 85. Shielding the first layer 70 from the signaling layer 85 may comprise disposing a deep N-well second layer 80 between the first layer 70 and the signaling layer 85.

Figure 2:
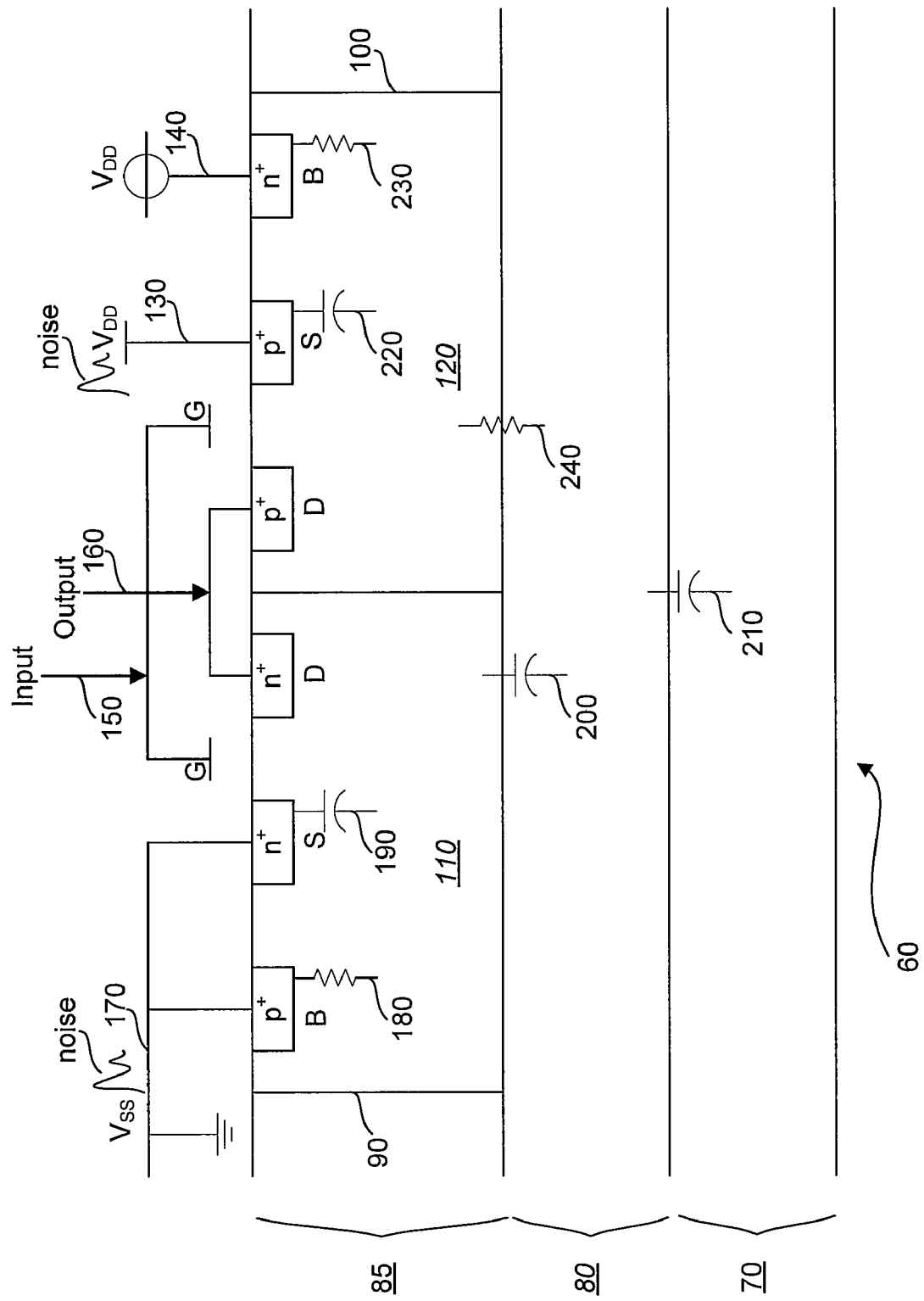
FIG. 2 shows an embodiment of a CMOS transistor arrangement according to the present invention.

FIG. 2 shows an embodiment of a complementary metal oxide semiconductor (CMOS) transistor arrangement 60 in accordance with the present invention. The CMOS transistor arrangement 60 may include a p-substrate 70 as a first layer, a deep n-well 80 as a second layer, an n-channel MOS (NMOS) transistor 90 as a first signaling component, and a p-channel MOS (PMOS) transistor 100 as a second signaling component. The NMOS transistor 90 may include, for example, a $p^+$-body (B), an $n^+$-source (S), and an $n^+$-drain (D), which may be disposed in a p-well 110. The p-well 110 may be an isolated p-well, for example, and may be disposed between two n-wells 120 and the deep n-well 80. A voltage source $V_{SS}$ 170 having an electrical ground may be coupled to the $p^+$-body (B) and the $n^+$-source (S) of the NMOS transistor 90. An input signal line 150 may be coupled to a gate of the NMOS transistor 90. An output signal line 160 may be coupled to the $n^+$-drain of the NMOS transistor 90.

The PMOS transistor 100 may include, for example, an $n^+$-body (B), a $p^+$-source (S), and a $p^+$-drain (D), which may be disposed in an n-well 120. A first voltage source $V_{DD}$ 130 may be coupled to the $p^+$-source (S). A second voltage source $V_{DD}$ 140 may be coupled to the $n^+$-body (B) of the PMOS transistor 100. In an embodiment according to the present invention, the second voltage source $V_{DD}$ 140 may be less noisy than the first voltage source $V_{DD}$ 130. In this regard, $V_{DD}$ 140 may be a quieter voltage source in comparison to the voltage source $V_{DD}$ 130. The input signal line 150 may be coupled to a gate of the PMOS transistor 100. The output signal line 160 may be coupled to the $p^+$-drain (D) of the PMOS transistor 100.

The voltage source $V_{DD}$ 130 and the quieter voltage source $V_{DD}$ 140 may be different voltage sources. The quieter voltage source $V_{DD}$ 140 may be a dedicated voltage source that is not coupled to some sources of noise, for example, and may be an active component of a transistor. The quieter voltage source $V_{DD}$ 140 may be dedicated, for example, to a guard bar for well taps or substrate taps. Alternatively, the voltage source $V_{DD}$ 130 and the quieter voltage source $V_{DD}$ 140 may be coupled to the same voltage source. However, the quieter voltage source $V_{DD}$ 140 may be isolated or separated from the voltage source $V_{DD}$ 130, wherein less noise may be carried by the quieter voltage source $V_{DD}$ 140.

In operation, the voltage source $V_{SS}$ 170 and the voltage source $V_{DD}$ 130 may be noisy due to a number of factors, some of which are described herein. For example, noise may be caused by circuitry found on or coupled to the chip that may directly or indirectly affect the voltage sources $V_{SS}$ 170 and/or $V_{DD}$ 130. High swing or high power devices, such as data drivers in a wire line communication system or transmitters in wireless communications systems, may be sources of noise. Noise may also be caused, for example, by the driving of active circuits. In one example, the voltage sources may be coupled to active circuitry (e.g., active portions of an inverter circuit), which may cause transient currents to flow during signal transitions from a high level to a low level or from a low level to a high level. In another example, noise may be caused by transitions in a signal propagated or generated by the chip and/or associated circuitry.

In accordance with an inventive CMOS transistor arrangement 60, one source of noise is that the voltage sources $V_{SS}$ 170 and/or $V_{DD}$ 130 may be coupled to the sources of the NMOS transistor 90 and the PMOS transistor 100. Thus, for example, when the circuit is in a transitional state, such as during a signal transition from a high level to a low level or from a low level to a high level, a transient current may flow between the voltage sources $V_{SS}$ 170 and/or $V_{DD}$ 130. Notably, if other devices (e.g., other CMOS transistor arrangements) share the voltage sources $V_{SS}$ 170 and/or $V_{DD}$ 130, then the noise generated by the transient current flows may be substantial.

The noise in the voltage source $V_{SS}$ 170 may flow into the body (B) and the source (S) of the NMOS transistor 90. The body (B) of the NMOS transistor 90 may be resistively coupled 180 to the p-well 110 and the source (S) of the NMOS transistor 90 may be capacitively coupled 190 to the p-well 110. The resistive coupling 180 may be much more substantial than the capacitive coupling 190. Accordingly, most of the noise in the p-well 110 may be associated with the p⁺-body of the NMOS transistor 90. For noise in the p-well 110 to reach the p-substrate 70, the noise may need to pass through two capacitive couplings: a capacitive coupling 200 between the p-well 110 and the deep n-well 80, and a capacitive coupling 210 between the deep n-well 80 and the p-substrate 70. Importantly, the capacitive coupling may generally be fairly weak, but the capacitive coupling may be even weaker when the couplings are placed in series. Thus, in an embodiment of the present invention, the resistive couplings 180, 200, and 210 between the p⁺-body (B) of the NMOS transistor 90 through to the p-substrate 70 may be replaced with a much weaker capacitive coupling.

The noise in voltage source $V_{DD}$ 130 may flow into the p⁺-source (S) of the PMOS transistor 100. In this embodiment, the present invention may employ a quieter voltage source $V_{DD}$ 140, which may be coupled to the n⁺-body (B) of the PMOS transistor 100. The p⁺-source (S) of the PMOS transistor 100 may be capacitively coupled 220 to the n-well 120 and the n⁺-body (B) of the PMOS transistor 100 may be resistively coupled 230 to the n-well 120. Because the resistive coupling 230 may be more substantial than the capacitive coupling, the noise in the n-well 120 may be mostly from the quieter voltage source $V_{DD}$ 140. Advantageously, noise in the n-well 120 may be substantially reduced, by connecting the quieter voltage source $V_{DD}$ 140 to the n⁺-body (B) of the PMOS transistor 100. The n-well 120 and the deep n-well 80 may be resistively coupled 240. Notably, the deep n-well 80 may provide a substantial amount of resistance to noise, thereby further reducing any noise propagating through PMOS resistor 100 and reaching substrate 70. The deep n-well 80 and the p-substrate 70 may be capacitively coupled, which may offer the noise only a weak coupling.

Although illustrated in use with a CMOS transistor arrangement, the present invention need not be so limited. The present invention may also be applicable for use with other types of transistors and/or other types of transistor arrangements. Notably, in an embodiment of the present invention, quiet voltage source $V_{DD}$ may be used to replace a conventional voltage source $V_{SS}$ without an area penalty. In this regard, the area used by voltage source $V_{DD}$ may replace the area used by voltage source $V_{SS}$ for example, in a block or standard resistor/transistor logic (RTL) arrangement. The present invention may also be applicable for use with other electrical, magnetic or electromagnetic components and/or circuits. Furthermore, although one or more of the embodiments described above may employ semiconductor materials (e.g., semiconductor material, compound semiconductor material, etc.), the present invention may also employ other materials (e.g., ceramics, metals, alloys, superconductors, etc.) and/or combinations thereof. In addition, the present invention may also contemplate employing different dopant types, dopant schemes, and/or dopant concentrations other than and/or in addition to the above-described dopant types, dopant schemes, and/or dopant concentrations.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for reducing noise in an electronic device, the method comprising:
   shielding a first layer doped with a first dopant from a signaling layer employing a second layer doped with a second dopant;
   coupling a first signaling component of said signaling layer to said second layer,
   coupling a second signaling component of said signaling layer to said second layer; and
   coupling said second layer to said first layer.

2. The method according to claim 1, wherein shielding said first layer from said signaling layer comprises disposing said second layer between said first layer and said signaling layer.

3. The method according to claim 1, wherein shielding said first layer from said signaling layer comprises disposing a deep N-well between said first layer and said signaling layer.

4. The method according to claim 1, wherein coupling said first signaling component to said second layer comprises capacitively coupling said first signaling component to said second layer.

5. The method according to claim 1, wherein coupling said second signaling component to said second layer comprises resistively coupling said second signaling component to said second layer.

6. The method according to claim 1, wherein said first signaling component comprises a first transistor.

7. The method according to claim 6, wherein said first transistor comprises a n-type transistor.

8. The method according to claim 1, wherein said second signaling component comprises a second transistor.

9. The method according to claim 8, wherein said second transistor comprises an p-type transistor.

10. The method according to claim 1, comprises capacitively coupling said second layer to said first layer.

* * * * *